US010529710B2

(12) United States Patent
Fu et al.

(10) Patent No.: US 10,529,710 B2
(45) Date of Patent: Jan. 7, 2020

(54) SEMICONDUCTOR DEVICE WITH LOCAL INTERCONNECT STRUCTURE AND MANUFACTURING METHOD THEREOF

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Fenghua Fu, Shanghai (CN); Yunchu Yu, Shanghai (CN); Yihua Shen, Shanghai (CN); Jian Pan, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 367 days.

(21) Appl. No.: 15/387,031

(22) Filed: Dec. 21, 2016

(65) Prior Publication Data
US 2017/0179122 A1 Jun. 22, 2017

(30) Foreign Application Priority Data

Dec. 22, 2015 (CN) .......................... 2015 1 0970425

(51) Int. Cl.
*H01L 21/768* (2006.01)
*H01L 27/088* (2006.01)
(Continued)

(52) U.S. Cl.
CPC ...... *H01L 27/0886* (2013.01); *H01L 21/0332* (2013.01); *H01L 21/76804* (2013.01);
(Continued)

(58) Field of Classification Search
CPC ........... H01L 21/0332; H01L 21/76804; H01L 21/76879; H01L 21/76889;
(Continued)

(56) References Cited

U.S. PATENT DOCUMENTS

2003/0054612 A1 3/2003 Cho et al.
2003/0127703 A1* 7/2003 Hikosaka .......... H01L 21/76877
257/520
(Continued)

FOREIGN PATENT DOCUMENTS

CN 101443902 5/2009
CN 103972213 8/2014
(Continued)

OTHER PUBLICATIONS

European Application No. 16204243.6, Extended European Search Report dated Jun. 29, 2017, 11 pages.
(Continued)

*Primary Examiner* — Chuong A Luu
(74) *Attorney, Agent, or Firm* — Kilpatrick Townsend & Stockton LLP

(57) ABSTRACT

A method for manufacturing a semiconductor device having a local interconnect structure includes providing a semiconductor substrate having a gate on an active region, a hardmask layer on the gate, and a first dielectric layer on the gate, etching the first dielectric layer to form a first interconnect trench on the active region, forming a metal silicide layer at a bottom of the first interconnect trench, forming a first metal layer filling the first interconnect trench, forming a second dielectric layer on the gate and the first interconnect
(Continued)

trench, etching the second dielectric layer to form a second interconnect trench in a staggered pattern relative to the first interconnect trench, etching the second dielectric layer to form a third interconnect trench, forming a second metal layer in the second interconnect trench and in the third interconnect trench to form the local interconnect structure.

10 Claims, 16 Drawing Sheets

(51) Int. Cl.
*H01L 21/033* (2006.01)
*H01L 21/8234* (2006.01)
*H01L 23/528* (2006.01)
*H01L 23/532* (2006.01)
*H01L 29/06* (2006.01)
*H01L 29/49* (2006.01)

(52) U.S. Cl.
CPC .. *H01L 21/76879* (2013.01); *H01L 21/76889* (2013.01); *H01L 21/76895* (2013.01); *H01L 21/823475* (2013.01); *H01L 23/5283* (2013.01); *H01L 23/53266* (2013.01); *H01L 29/0642* (2013.01); *H01L 29/4975* (2013.01)

(58) Field of Classification Search
CPC ............. H01L 21/76895; H01L 21/033; H01L 21/8234; H01L 21/768; H01L 21/823475; H01L 21/02; H01L 21/285; H01L 21/311; H01L 21/022; H01L 21/02126; H01L 21/28518; H01L 29/0642; H01L 29/4975; H01L 29/06
USPC ........ 438/151, 284, 286, 218, 283, 586, 667
See application file for complete search history.

(56) References Cited

U.S. PATENT DOCUMENTS

| | | |
|---|---|---|
| 2006/0046398 A1 | 3/2006 | McDaniel et al. |
| 2011/0068411 A1 | 3/2011 | Sun et al. |
| 2012/0122284 A1* | 5/2012 | Kim ................. H01L 21/823425 438/287 |
| 2012/0156867 A1* | 6/2012 | Jeong ................. H01L 21/76897 438/586 |
| 2014/0073104 A1 | 3/2014 | Chen et al. |
| 2014/0131832 A1* | 5/2014 | Yang .................... H01L 21/3081 257/506 |
| 2014/0134845 A1* | 5/2014 | Zhang ............... H01L 21/76816 438/702 |
| 2014/0209984 A1* | 7/2014 | Liang ................ H01L 23/53266 257/288 |
| 2014/0252433 A1 | 9/2014 | Shieh et al. |
| 2015/0270171 A1 | 9/2015 | Basker et al. |
| 2017/0098582 A1* | 4/2017 | Yin ................... H01L 21/82382 |

FOREIGN PATENT DOCUMENTS

| | | |
|---|---|---|
| CN | 104037122 | 9/2014 |
| EP | 3188225 | 7/2017 |
| KR | 20090052508 | 5/2009 |

OTHER PUBLICATIONS

Chinese Application No. 201510970425.X, Office Action dated Feb. 28, 2019, 7 pages.

* cited by examiner

SEMICONDUCTOR DEVICE WITH LOCAL INTERCONNECT STRUCTURE AND MANUFACTURING METHOD THEREOF

CROSS-REFERENCES TO RELATED APPLICATIONS

The present application claims priority to Chinese patent application No. 201510970425.X, filed with the State Intellectual Property Office of People's Republic of China on Dec. 22, 2015, the content of which is incorporated herein by reference in its entirety.

FIELD OF THE INVENTION

The present invention relates to semiconductor technology, and more particularly to a semiconductor device having a local interconnect structure and manufacturing method thereof.

BACKGROUND OF THE INVENTION

In traditional semiconductor manufacturing processes of a local interconnect structure, in particularly, in a manufacturing process of a local interconnect structure of a fin field-effect transistor (FinFET) device, due to the small feature size and high density of the integration, requirements on the manufacturing process can be relatively high. For example, for a local interconnect structure of a FinFET device of technology nodes below 20 nm, due to technology constraints of current lithography processes, the formation of a small-size local interconnect structure may require a double patterning lithography (double exposure lithography) process which involves complicated process steps and imposes relatively high technology requirements.

FIG. 1 is a plan view of an exemplary FinFET device 100 having a local interconnect structure that can be used to explain the principles of the present invention. Device 100 includes multiple fins 101, multiple gates 102, a first interconnect layer 103, a second interconnect layer 104, and a gate interconnect layer 105. Double patterning lithography may be required for technology nodes below 20 nm. A double patterning lithography process may include performing a first etching process using a first mask to form a trench in first interconnect layer 103, then performing a second etching process using a second mask to form a trench in second interconnect layer 104. Thereafter, a metal silicide layer is formed at the bottom of the trench of first interconnect layer 103 and at the bottom of the trench of second interconnect layer 104. Next, a third etching process is performed to form a trench in gate interconnect layer 105 using a mask, and a metal layer is deposited to fill each of the trenches and to form a local interconnect structure. As can be seen in the conventional technique, the trench in first interconnect layer 103 and the trench in second interconnect layer 104 are formed separately, and the accuracy requirements on the patterned mask and on the etching coverage are high, which impose a challenge in the manufacturing process of a local interconnect structure of technology nodes below 20 nm.

BRIEF SUMMARY OF THE INVENTION

The inventors have discovered the problems described above and provide a novel solution to the above-described problems.

Embodiments of the present invention thus provide a novel method for manufacturing a semiconductor device having a local interconnect structure. The method includes providing a semiconductor substrate having a plurality of gates on an active region, a hardmask layer on the gates, and a first dielectric layer disposed between the gates. The method also includes performing a first etching process on the first dielectric layer to form a first interconnect trench on the active region, forming a metal silicide layer at a bottom of the first interconnect trench, forming a first metal layer filling the first interconnect trench, forming a second dielectric layer on the gates and the first interconnect trench, performing a second etching process on the second dielectric layer to form a second interconnect trench in a staggered pattern relative to the first interconnect trench, performing a third etching process on the second dielectric layer to form a third interconnect trench, and forming a second metal layer in the second interconnect trench and in the third interconnect trench to form the local interconnect structure.

In one embodiment, performing the first etching process includes forming a first mask layer on the first dielectric layer, patterning the first mask layer to expose a portion of the first dielectric layer on the active region, etching the exposed portion of the first dielectric layer to form the first interconnect trench, and removing the first mask layer.

In one embodiment, performing the second etching process includes forming a second mask layer on the second dielectric layer, patterning the second mask layer to expose a portion of the second dielectric layer in a staggered arrangement relative to the first interconnect trench, etching the exposed portion of the second dielectric layer to form the second interconnect trench in the staggered pattern relative to the first interconnect trench, and removing the second mask layer.

In one embodiment, the method may also include forming a first anti-reflective coating (DARC) layer between the second mask layer and the second dielectric layer, performing the third etching process on the second dielectric layer to form the third interconnect trench, and removing the first DARC layer.

In one embodiment, performing the third etching process includes forming an optical dispersive layer (ODL) on the second dielectric layer, forming a third mask layer on the ODL layer, patterning the third mask layer, etching a portion of the ODL layer, a portion of the second dielectric layer, and a portion of the hardmask layer using the patterned third mask layer as a mask to form the third interconnect trench, and removing the third mask layer and the ODL layer.

In one embodiment, the method may further include forming a second DARC layer between the ODL layer and the third mask layer, etching the ODL layer and the second dielectric layer to form the third interconnect trench, and removing the third mask layer, the second DARC layer, and the ODL layer.

In one embodiment, the gates are high-k dielectric metal gates, i.e., the gates are metal gate electrodes including a high dielectric constant (high-k) dielectric within a metal gate stack.

In one embodiment, the metal silicide layer is a titanium silicide layer.

In one embodiment, the semiconductor substrate includes a plurality of fins on the active region, and a shallow trench isolation structure disposed between adjacent fins.

Embodiments of the present invention also provide a semiconductor device having a local interconnect structure. The semiconductor device includes a semiconductor substrate having a plurality of gates on an active region, a hardmask layer on the gates, and a first dielectric layer disposed between the gates, a first interconnect trench on the active region, the first interconnect trench comprising a bottom covered with a metal silicide layer and filled with a first metal layer, a second dielectric layer on the first dielectric layer, a second interconnect trench in a staggered arrangement relative to the first interconnect trench. The semiconductor device also includes a third interconnect trench on the gates, and a second metal layer filling the second interconnect trench and the third interconnect trench.

In one embodiment, the gates are high-k dielectric metal gates.

In one embodiment, the metal silicide layer comprises a titanium silicide layer.

In one embodiment, the semiconductor substrate includes a plurality of fins on the active region, and a shallow trench isolation structure disposed between adjacent fins The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1:
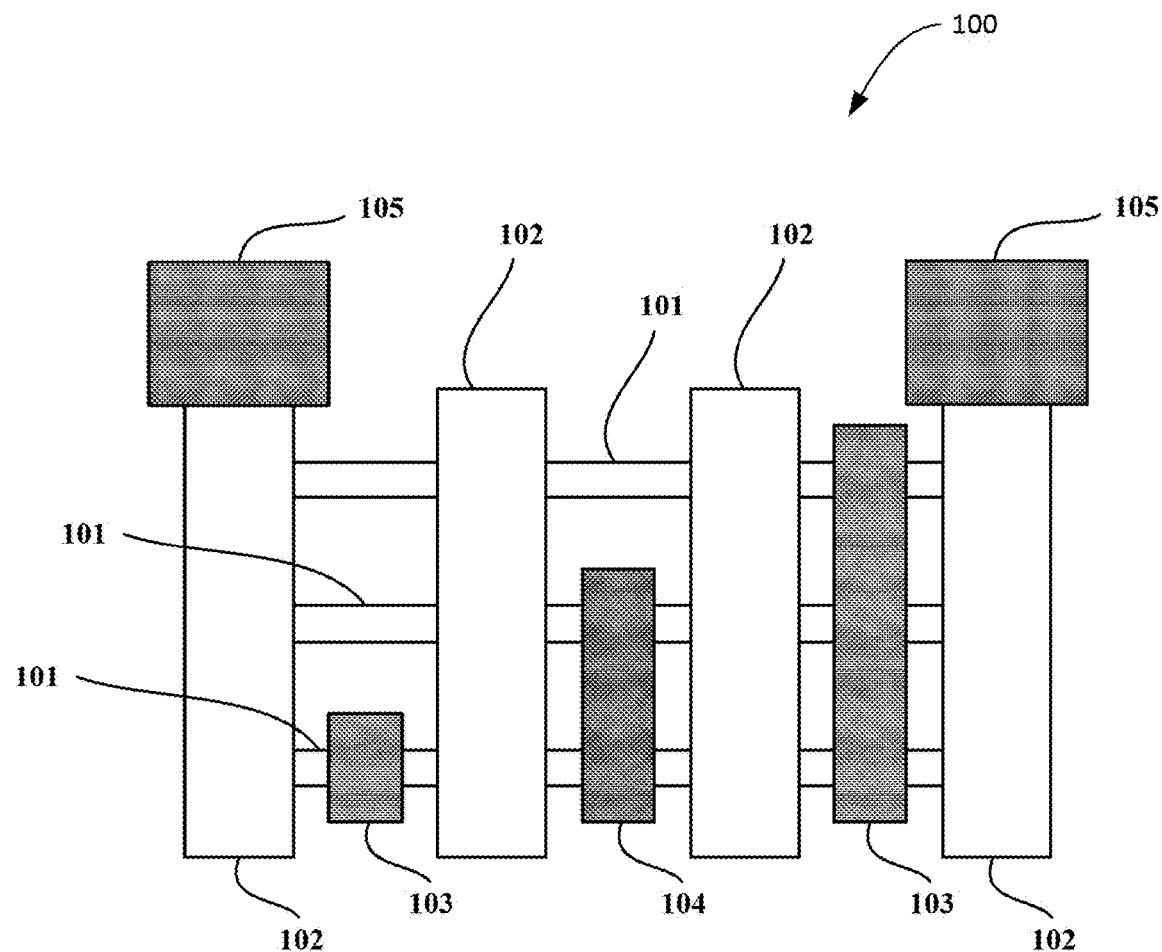
FIG. 1 is a schematic plan view of a local interconnect structure of a semiconductor device, as known in the prior art.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably.

Embodiments of the present invention now will be described more fully hereinafter with reference to the accompanying drawings, in which embodiments of the invention are shown. This invention may, however, be embodied in many different forms and should not be construed as limited to the embodiments set forth herein.

Figure 2:
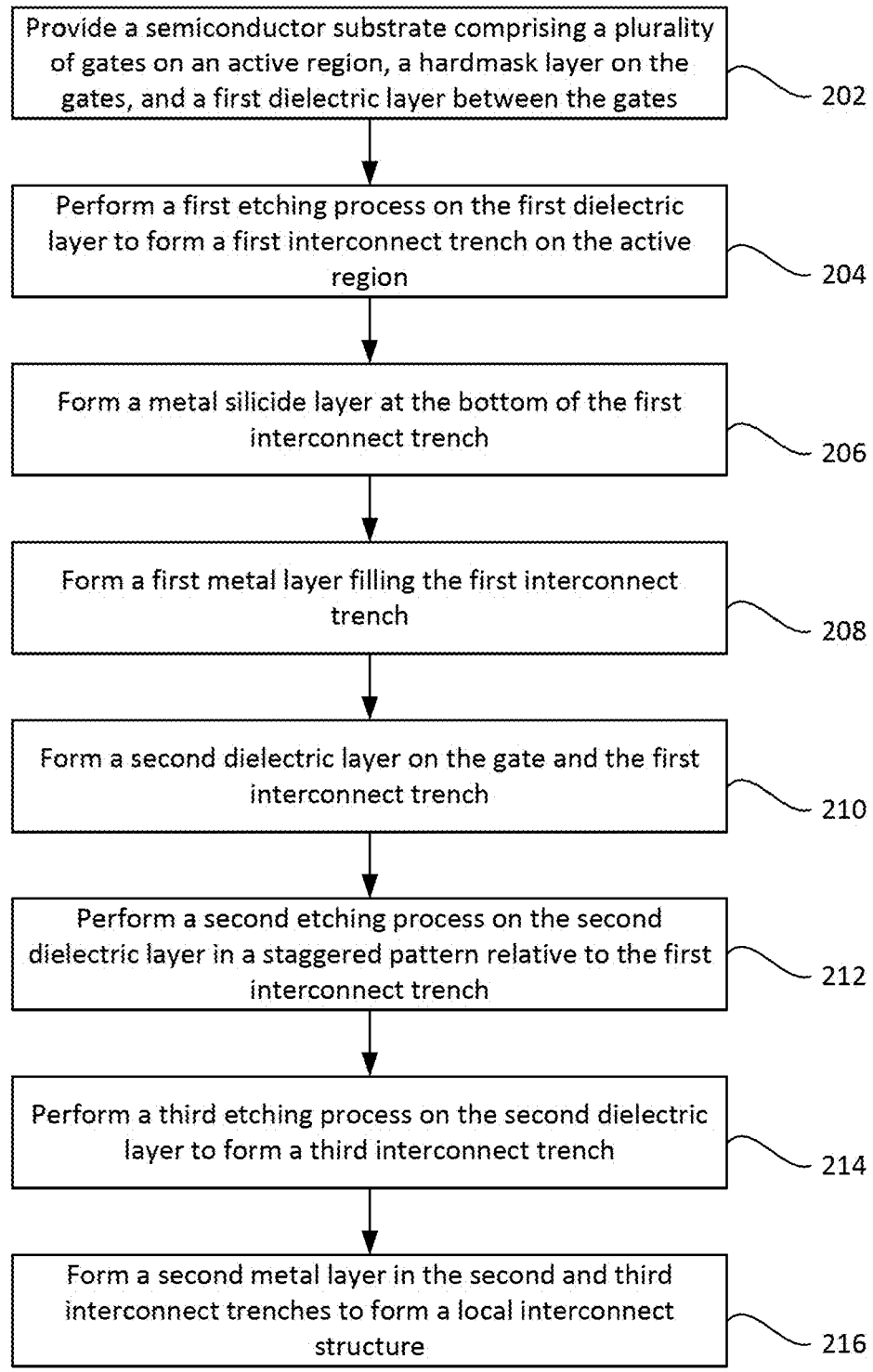
FIG. 2 is a simplified flowchart of a method for manufacturing a semiconductor device having a local interconnect structure according to an embodiment of the present invention.

FIG. 2 is a simplified flowchart of a method for manufacturing a semiconductor device according to an embodiment of the present invention. Referring to FIG. 2, the method may include the following process steps:

At 202: providing a semiconductor substrate. The semiconductor substrate may include a plurality of active regions, a plurality of gates on the active regions, a hardmask layer on the gates, and a first dielectric layer disposed between the gates. The first dielectric layer may be silicon dioxide or other dielectric material known in the art. The hardmask layer may be silicon nitride or other hardmask material known in the art.

In an embodiment, the semiconductor device includes a plurality of FinFET devices. The semiconductor substrate may includes multiple fins, each of the fins may correspond to one of the active regions. The gates may be high-k dielectric metal gate electrodes. A shallow trench isolation structure may be disposed between the fins.

In an embodiment, spacers are disposed between the gate sidewalls and the hardmask layer.

At 204: performing an etching process on the first dielectric layer to form a first interconnect trench in an active region.

In an embodiment, a first mask layer, e.g., a photoresist, is formed on the first dielectric layer. The first mask layer is patterned to expose a portion of the first dielectric layer on the active region. The first dielectric layer is then etched using the patterned first mask as a mask to form a first interconnect trench in the active region. Thereafter, the first mask layer is removed.

At 206: depositing a metal silicide layer at the bottom of the first interconnect trench.

In an embodiment, the metal silicide layer may include, but not limited to, a metal material such as titanium, cobalt, platinum, and nickel. In a preferred embodiment, the metal silicide layer may include titanium silicide.

At 208: depositing a first metal layer filling the first interconnect trench.

In an embodiment, the first metal layer may include, but not limited to, copper, tungsten, cobalt, nickel, titanium and other metals, or titanium nitride, tantalum nitride, and other electrically conductive metal carbides and electrically conductive metal oxides. The deposition of the first metal layer may be performed using any conventional metal deposition processes, such as sputtering, physical vapor deposition (PVD), chemical vapor deposition (CVD), and the like processes. Thereafter, a chemical mechanical polishing (CMP) process is performed to remove excess portions of the first metal layer above and outside the first interconnect trench.

At 210: depositing a second dielectric layer on the substrate covering the gates and the first metal layer.

At 212: performing a second etching process on the second dielectric layer to form a second interconnect trench in a staggered arrangement relative to the first interconnect trench.

In an embodiment, a second mask layer, e.g., a photoresist, is formed on the second dielectric layer; the second mask layer is then patterned to form a pattern that is staggered relative to the first interconnect trench. The second dielectric layer is then etched using the second patterned mask layer as a mask to form the second interconnect trench in the staggered arrangement relative to the first interconnect trench. The second patterned mask layer is then removed. As would be readily appreciated by those of skill in the art, the second interconnect trench needs only be in electrical contact with the first metal layer of the first interconnect trench in the vertical direction, the second interconnect trench, however, is not required to completely overlap the first interconnect trench.

In an embodiment, prior to depositing the second dielectric layer, a first dielectric anti-reflective coating (DARC) layer may be first deposited. The first DARC layer may include SiON formed by a chemical vapor deposition process to reduce the reflectance of the hardmask layer.

At 214: performing a third etching process on the second dielectric layer to form a third interconnect trench on the gates.

In an embodiment, an optical dispersive layer (ODL) is deposited on the second dielectric layer as a mask for etching the hardmask layer. The ODL serves to refract portions of light waves that pass through it. A third mask layer, e.g., a photoresist, is formed on the ODL layer. The third mask is then patterned to form a third interconnect trench on the gates. A third etching process is performed on the second dielectric layer using the third patterned mask as a mask. Due to the presence of the ODL layer, the hardmask layer may be etched, so that the third etching process also removes an exposed portion of the second dielectric layer to form a third interconnect trench.

In an embodiment, a second DARC layer is formed between the ODL layer and the second hardmask layer. After forming the third interconnect trench, the third mask layer, the second DARC layer, and the ODL layer are removed.

At 216: depositing a second metal layer in the second interconnect trench and in the third interconnect trench to form a local interconnect structure.

In an embodiment, the second metal layer may include, but not limited to, copper, tungsten, cobalt, nickel, titanium, aluminum, and other metal materials, or titanium nitride, tantalum nitride, electrically conductive metal carbides, and electrically conductive metal oxides. The second metal layer may be deposited using any conventional metal deposition techniques, such as sputtering, physical vapor deposition (PVD), and chemical vapor deposition (CVD) processes. Thereafter, a chemical mechanical polishing (CMP) process is performed to remove excess portions of the second metal layer above and outside the second interconnect trench, so that the second metal layer is only deposited inside and not above the second interconnect trench. As would be readily appreciated by those of skill in the art, the second metal layer needs only to be in electrical and physical contact with the first metal layer of the first interconnect trench, and is not required to completely overlap the first meta layer.

The above described process steps complete the formation of the first and second metal layers that form the local interconnect structure according to an embodiment of the present invention.

Figure 16:
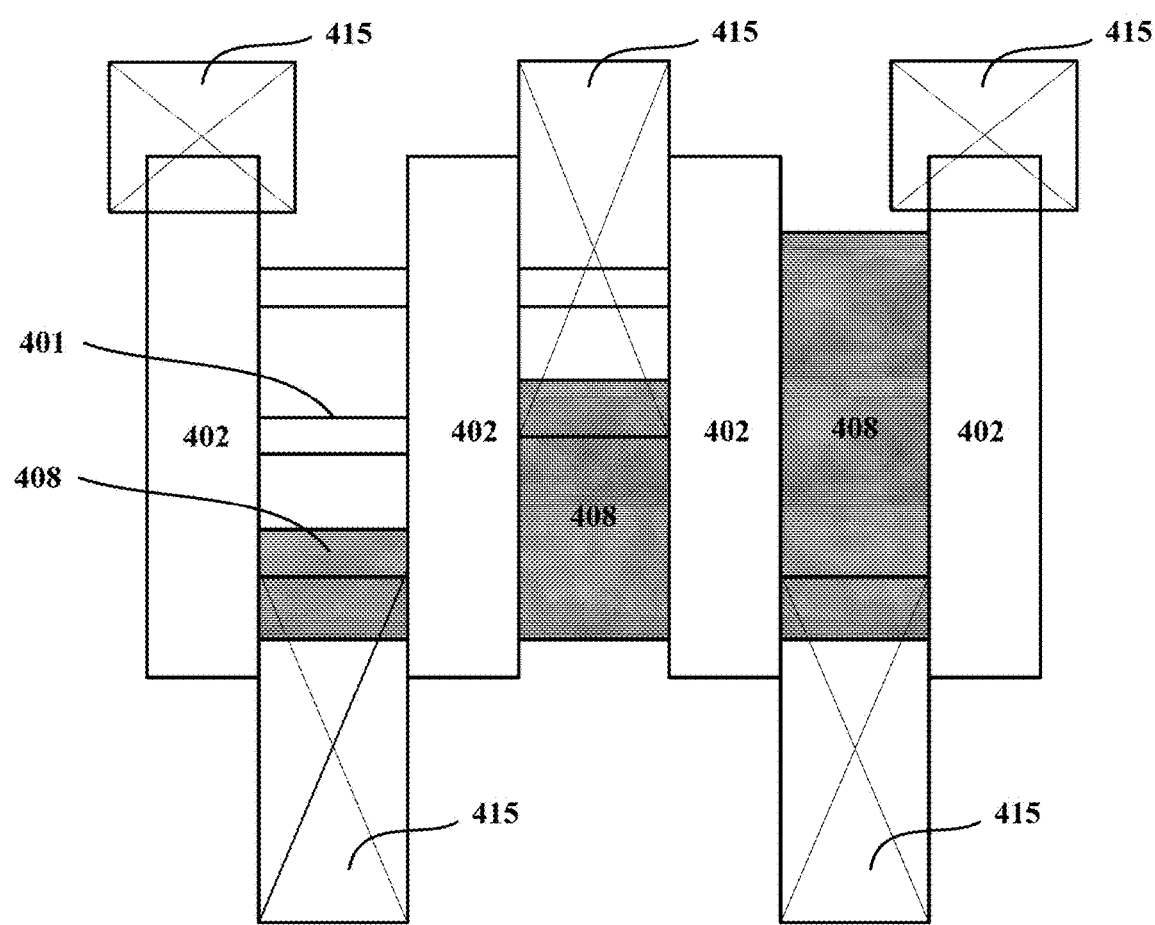
FIG. 16 is a plan view of a semiconductor device having a local interconnect structure according to an embodiment of the present invention.

FIG. 16 shows a plan view of a device including a local interconnect structure formed using a manufacturing method according to an embodiment of the present invention. The device includes a fin 401, a gate 402, a first metal layer 408, and a second metal layer 415 in a staggered arrangement relative to the first metal layer 408. The first metal layer 408 and the second metal layer 415 form a local interconnect structure according to an embodiment of the present invention. The second metal layer 415 is disposed on the first metal layer 408 and is in electrical contact with the first metal layer 408. The first interconnect trench is formed using only one etching process, thus avoiding the double patterning process, to obtain a local interconnect structure having a metal silicide layer with a lower step coverage, while reducing the design constraints of the device and improving the device performance.

FIGS. 3A-3B through 15A-15B are respective cross-sectional views in the x-direction and in the y-direction (perpendicular to the x-direction) illustrating an intermediate stage of a semiconductor device in a manufacturing method according to the embodiment of the present invention. Using a FinFET device as example, FIG. with a label denoted "xA" is a cross sectional view taken vertically to the direction of a fin, and FIG. with a label denoted "xB" is a cross sectional view taken along the direction of the fin, where x is from 3 to 15.

Figure 3A:
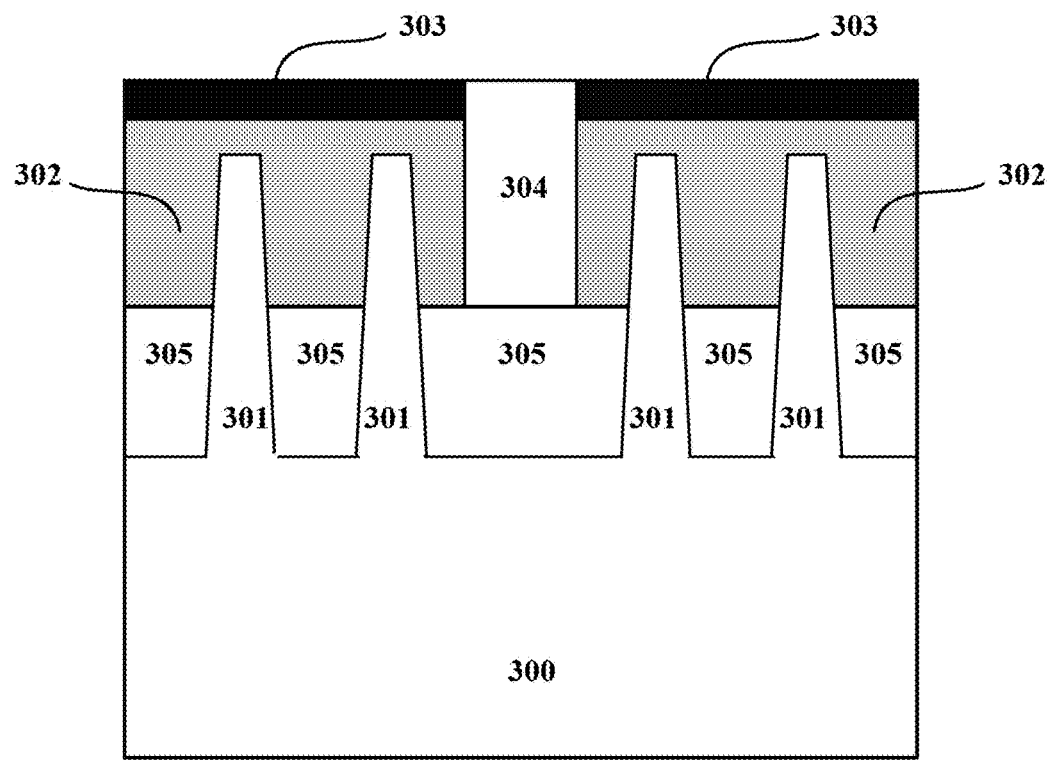
FIGS. 3A and 3B are respective cross-sectional views in the x-direction (a first direction along the semiconductor device) and in the y-direction (a second direction perpendicular to the first direction along the semiconductor device) illustrating an intermediate stage of a semiconductor device in a manufacturing method according to the embodiment of the present invention.
Figure 3B:
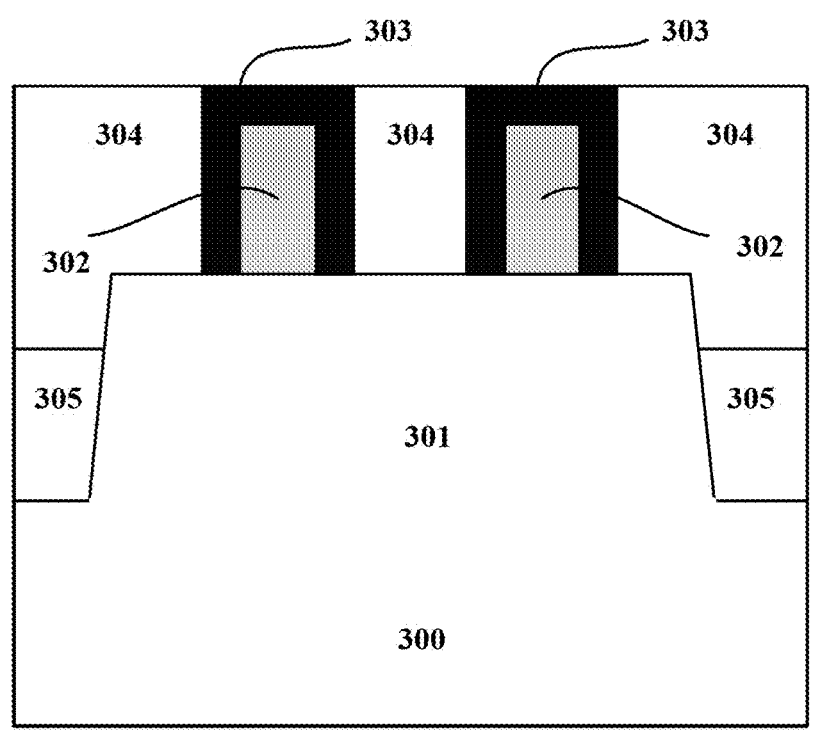

Referring to FIGS. 3A and 3B, a semiconductor substrate 300 is provided. Multiple fins (alternatively and collectively referred to as a fin) 301, multiple gates (alternatively and collectively referred to as a gate) 302, a hardmask layer 303, a first dielectric layer 304, and a shallow trench isolation structure 305 are disposed on semiconductor substrate 300. Hardmask layer 303 may be silicon nitride or other hardmask material known to a person skilled in the art.

In an embodiment, gate 302 may be a high-k dielectric metal gate electrode, i.e., a gate stack including a metal gate electrode and a high-k dielectric layer underlying the metal gate electrode and on sidewalls of the metal gate electrode. Spacers (not shown) may be formed between sidewalls of gate 302 and hardmask layer 303.

Figure 4A:
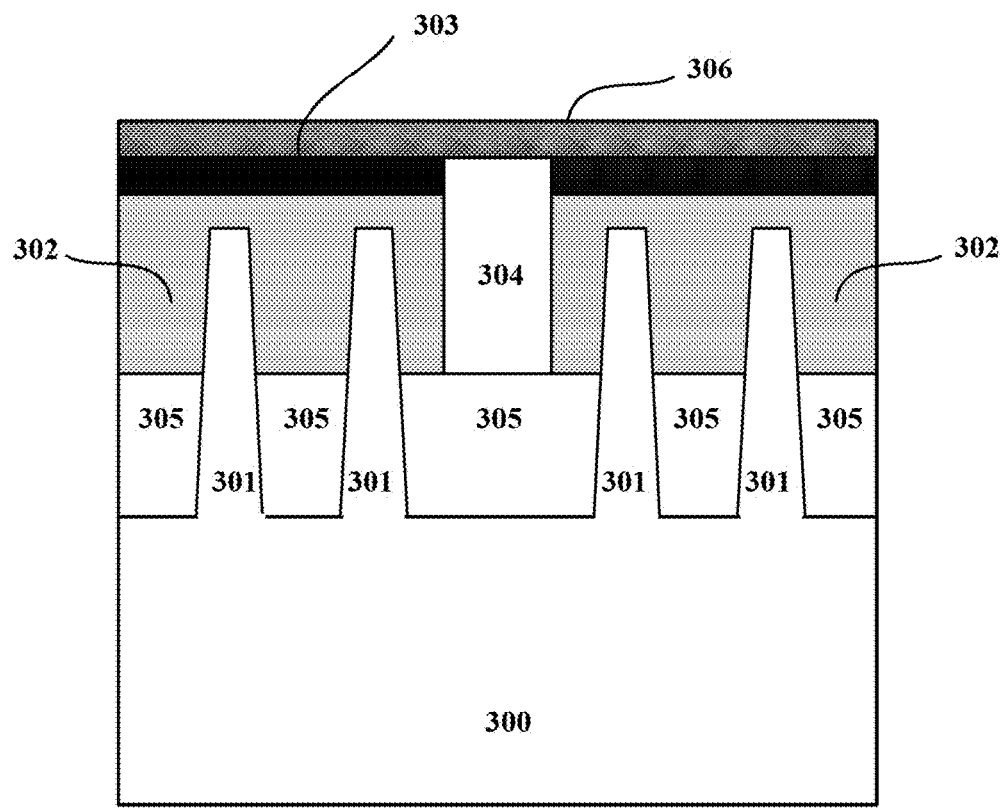
FIGS. 4A and 4B are respective cross-sectional views in the x-direction and in the y-direction illustrating an intermediate stage of a semiconductor device in a manufacturing method according to the embodiment of the present invention.
Figure 4B:
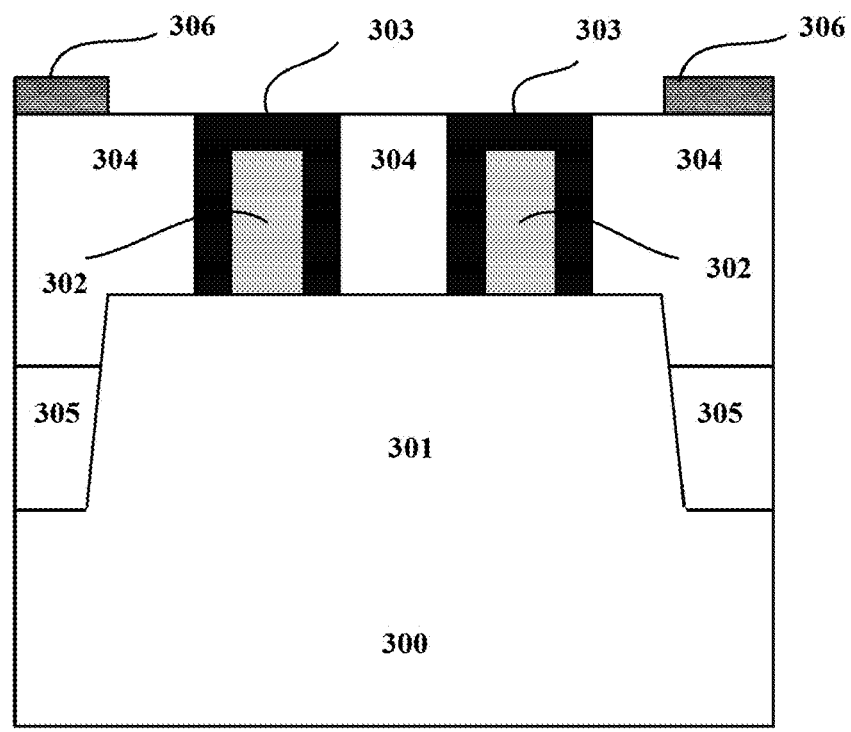

Referring to FIGS. 4A and 4B, a first mask layer 306 is formed on first dielectric layer 304. First mask layer 306 is then patterned to expose a portion of first dielectric layer 304 on the active region to form a local interconnect. The formed local interconnect is shown in FIGS. 4A and 4B. Referring to FIG. 4B, the patterned first mask layer 306 concurrently exposes first dielectric layer 304 on the action region and the local interconnect and gate 302 disposed on the active region.

Figure 5A:
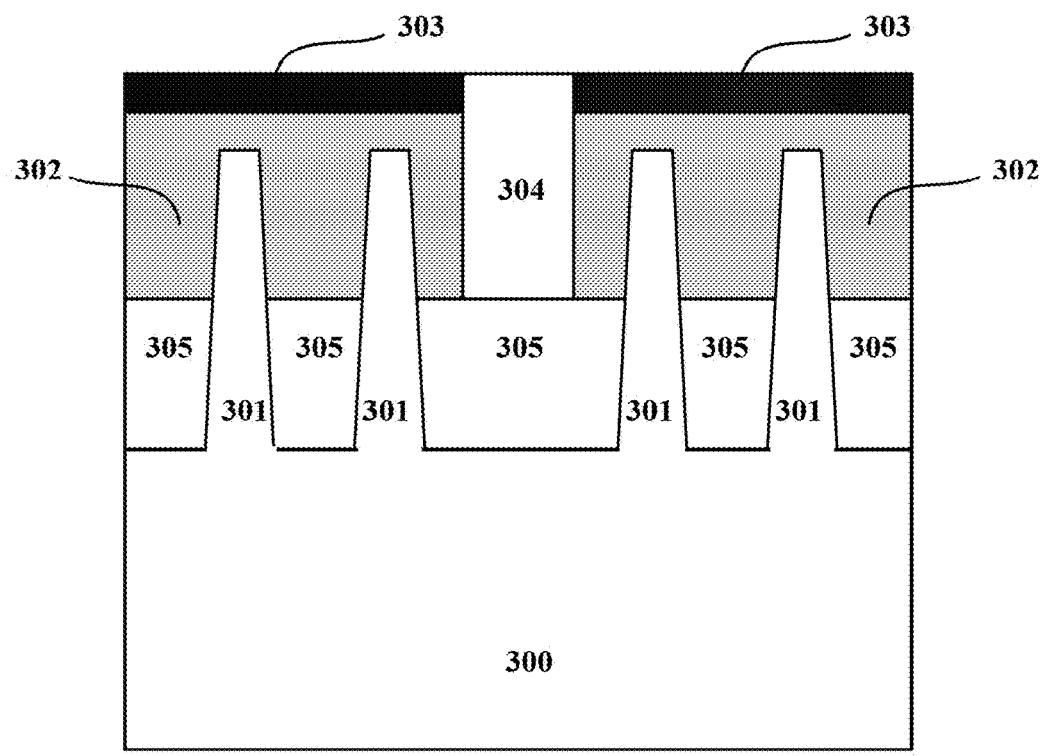
FIGS. 5A and 5B are respective cross-sectional views in the x-direction and in the y-direction illustrating an intermediate stage of a semiconductor device in a manufacturing method according to the embodiment of the present invention.
Figure 5B:
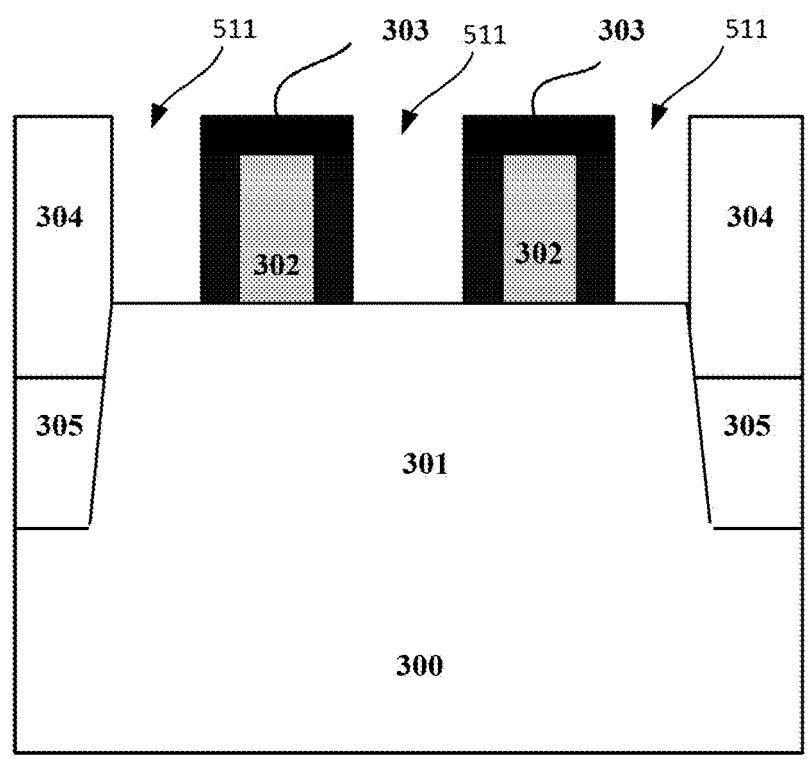

Referring to FIGS. 5A and 5B, first dielectric layer 304 is etched using the patterned mask layer 306 as a mask. Since gate 302 is covered by hardmask layer 303, gate 302 is thus not etched. After first dielectric layer 304 has been etched, a first interconnect trench 511 is formed on the active region, and the patterned mask layer 306 is removed. FIG. 5B shows an intermediate structure having a first interconnect trench 511 formed on the active region through etching of first dielectric layer 304.

Figure 6A:
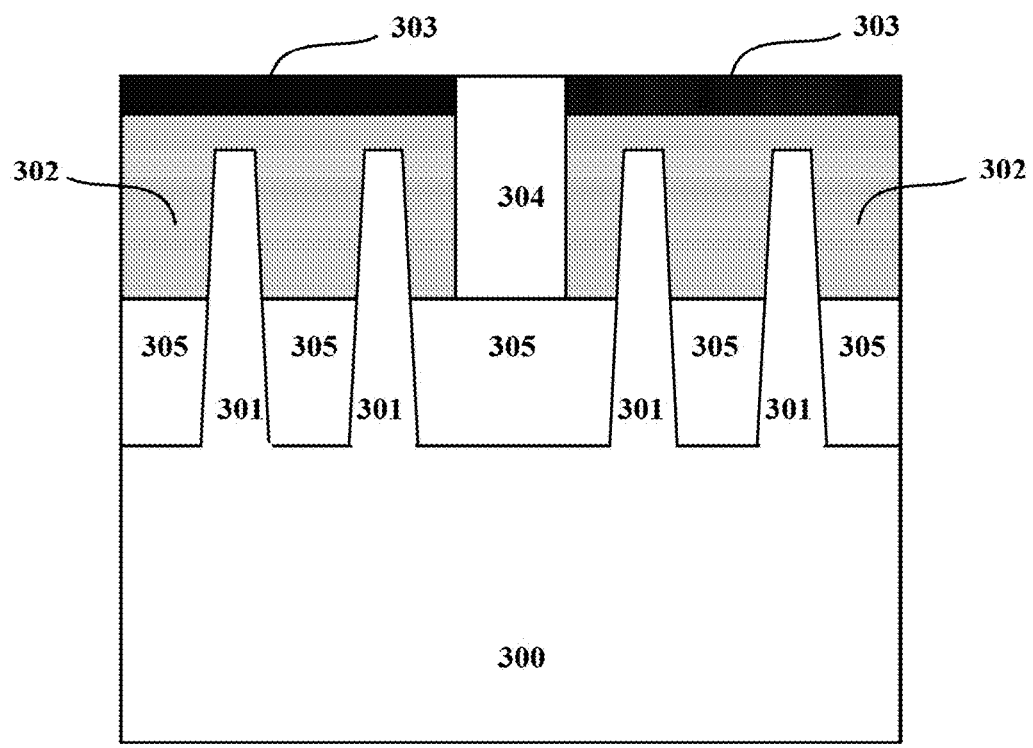
FIGS. 6A and 6B are respective cross-sectional views in the x-direction and in the y-direction illustrating an intermediate stage of a semiconductor device in a manufacturing method according to the embodiment of the present invention.
Figure 6B:
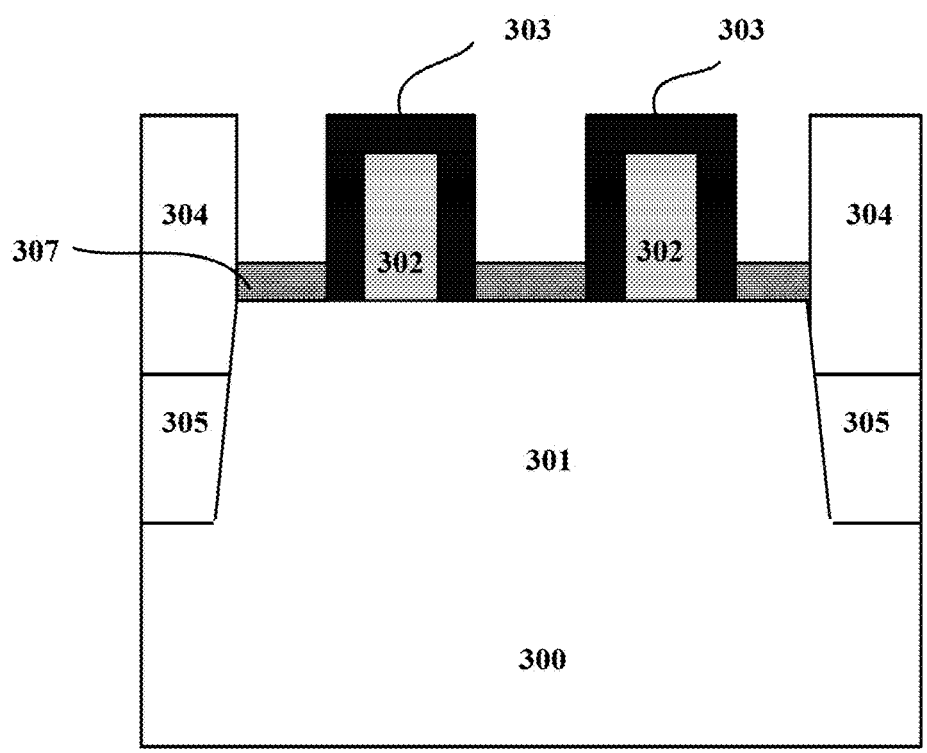

Referring to FIGS. 6A and 6B, a metal silicide layer 307 is deposited at the bottom of first interconnect trench 511.

In an embodiment, the metal material of the formed metal silicide layer 307 may include, but not limited to, titanium, cobalt, platinum, and nickel. In a preferred embodiment, the metal silicide is titanium silicide. FIG. 6B is an intermediate structure illustrating the first interconnect trench having a metal silicide layer 307 formed at its bottom. In accordance with the present invention, a first interconnect trench is first formed by etching, a metal silicide layer is formed at the bottom of the first interconnect trench, a second interconnect trench is then formed in a staggered arrangement relative to the first interconnect trench. A low aspect ratio of the first interconnect trench improves the step coverage of metal silicide 307 while reducing the complexity of the photolithography process.

Figure 7A:
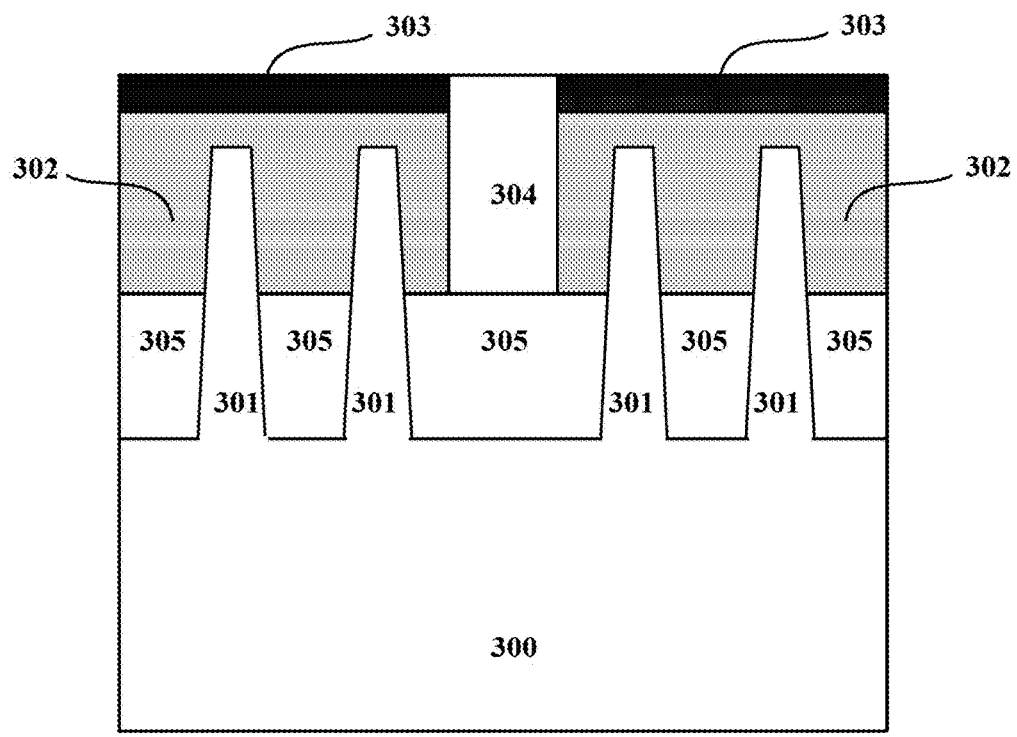
FIGS. 7A and 7B are respective cross-sectional views in the x-direction and in the y-direction illustrating an intermediate stage of a semiconductor device in a manufacturing method according to the embodiment of the present invention.
Figure 7B:
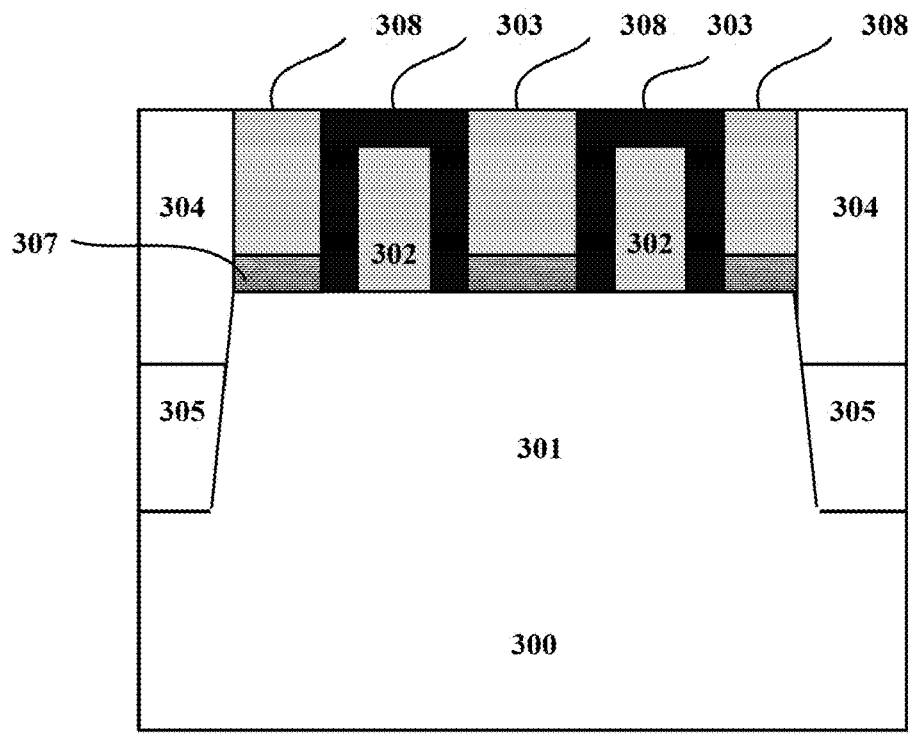

Referring to FIGS. 7A and 7B, a first metal layer 308 is deposited filling the first interconnect trench.

In an embodiment, the metal material of the first metal layer 308 may include, but not limited to, copper, tungsten, cobalt, nickel, titanium, aluminum, and other metal material, or titanium nitride, electrically conductive metal oxides, electrically conductive metal carbides, and the like. The deposition of the first metal layer may be performed using any conventional metal deposition processes, such as sputtering, physical vapor deposition (PVD), and chemical vapor deposition (CVD) processes. Thereafter, a chemical mechanical polishing (CMP) process is performed to remove excess portions of the first metal layer above and outside the first interconnect trench. FIG. 7B is an intermediate structure illustrating the first interconnect trench filled with first metal layer 308.

Figure 8A:
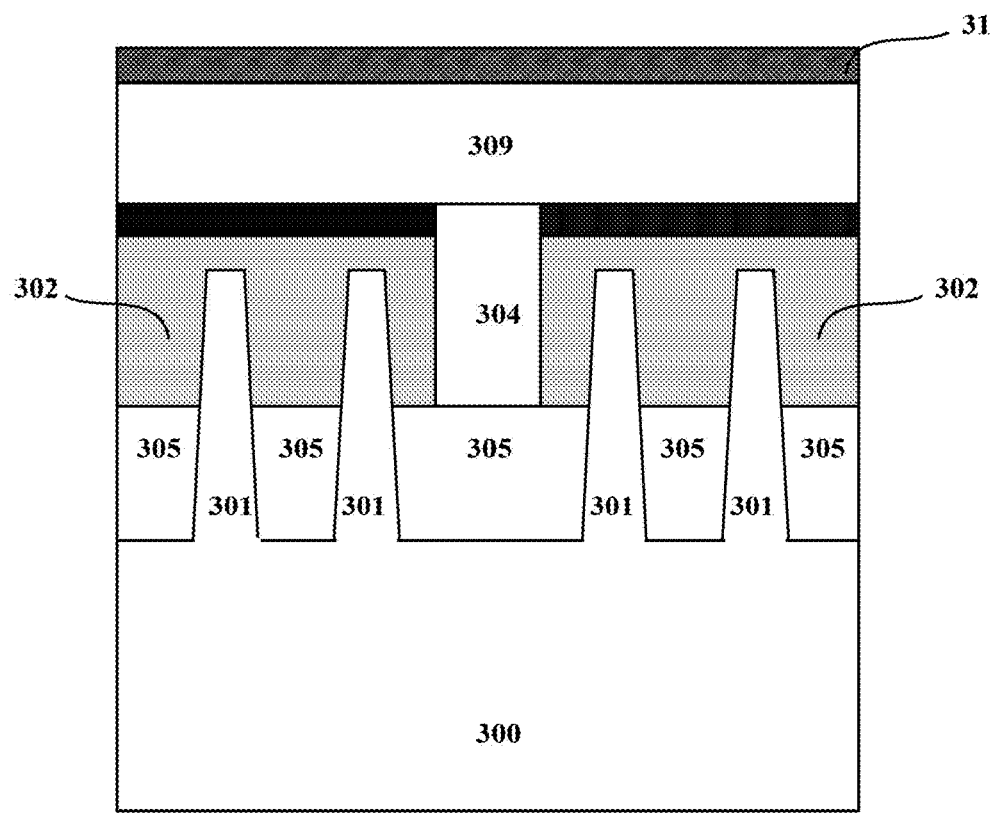
FIGS. 8A and 8B are respective cross-sectional views in the x-direction and in the y-direction illustrating an intermediate stage of a semiconductor device in a manufacturing method according to the embodiment of the present invention.
Figure 8B:
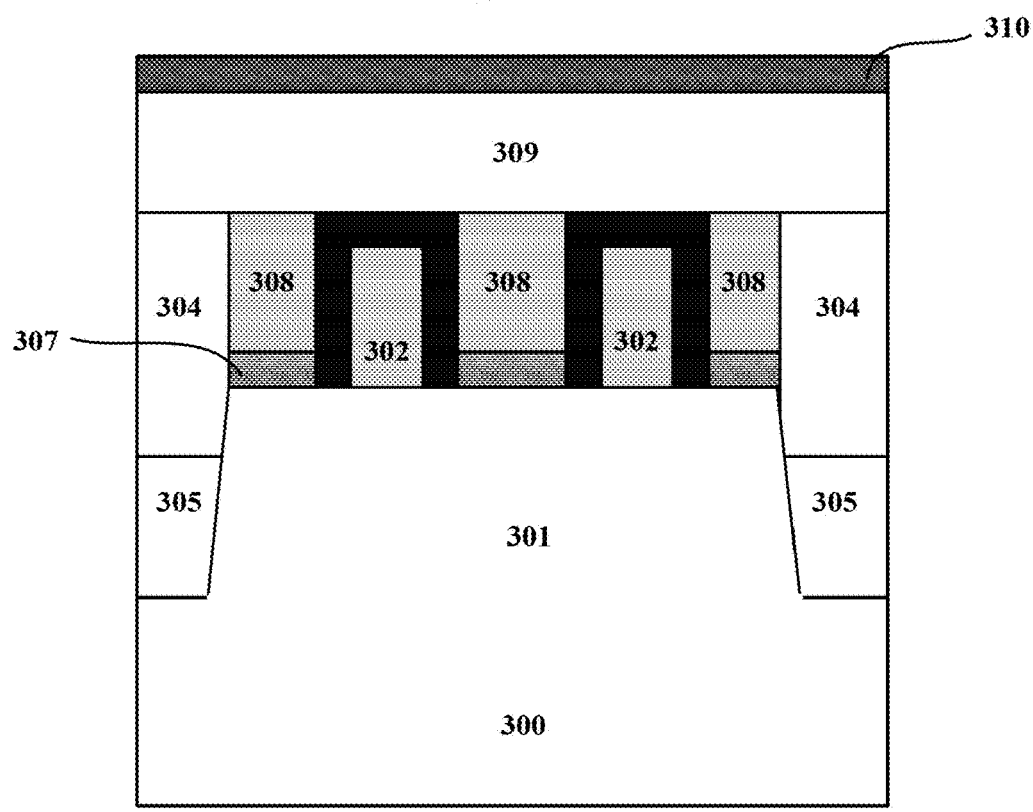

Referring to FIGS. 8A and 8B, a second dielectric layer 309 is deposited on gate 302 and the first interconnect trench.

In an embodiment, a first DARC layer 310 is formed over second dielectric layer 309. DARC layer 310 may be deposited using a chemical vapor deposition (CVD) process and serves to reduce the reflectance of the hardmask layer. Second dielectric layer 309 covers gate 302 and the first interconnect trench filled with first metal layer 308, as shown in FIGS. 8A and 8B.

Figure 9A:
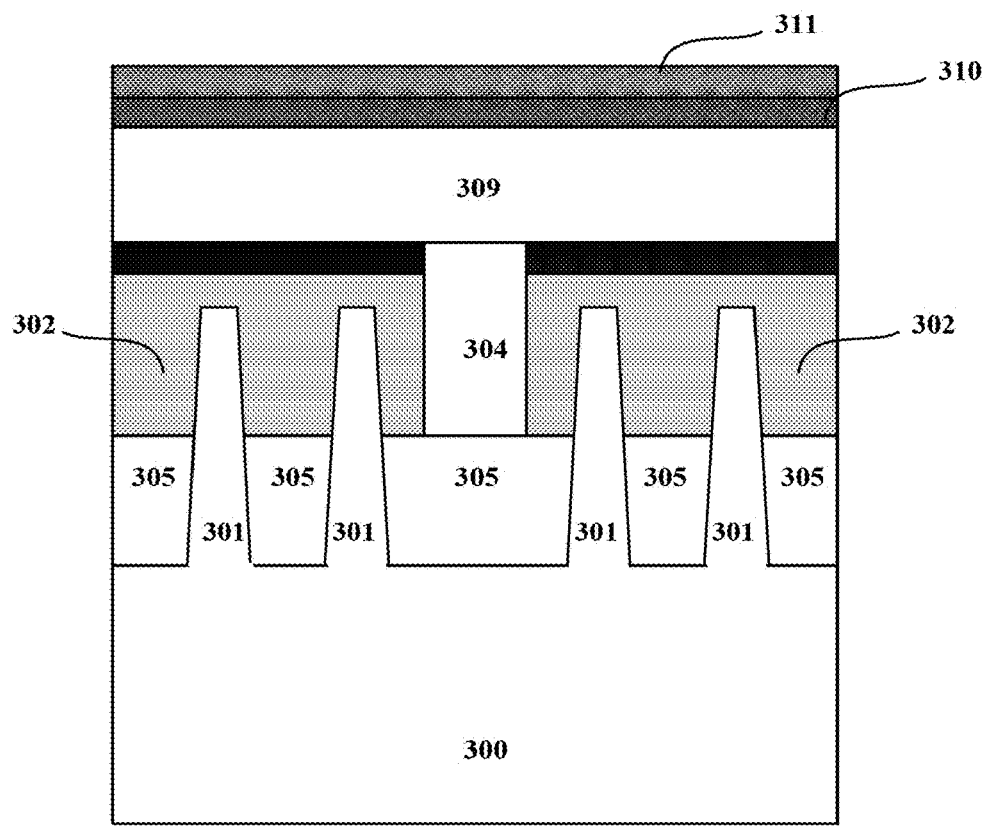
FIGS. 9A and 9B are respective cross-sectional views in the x-direction and in the y-direction illustrating an intermediate stage of a semiconductor device in a manufacturing method according to the embodiment of the present invention.
Figure 9B:
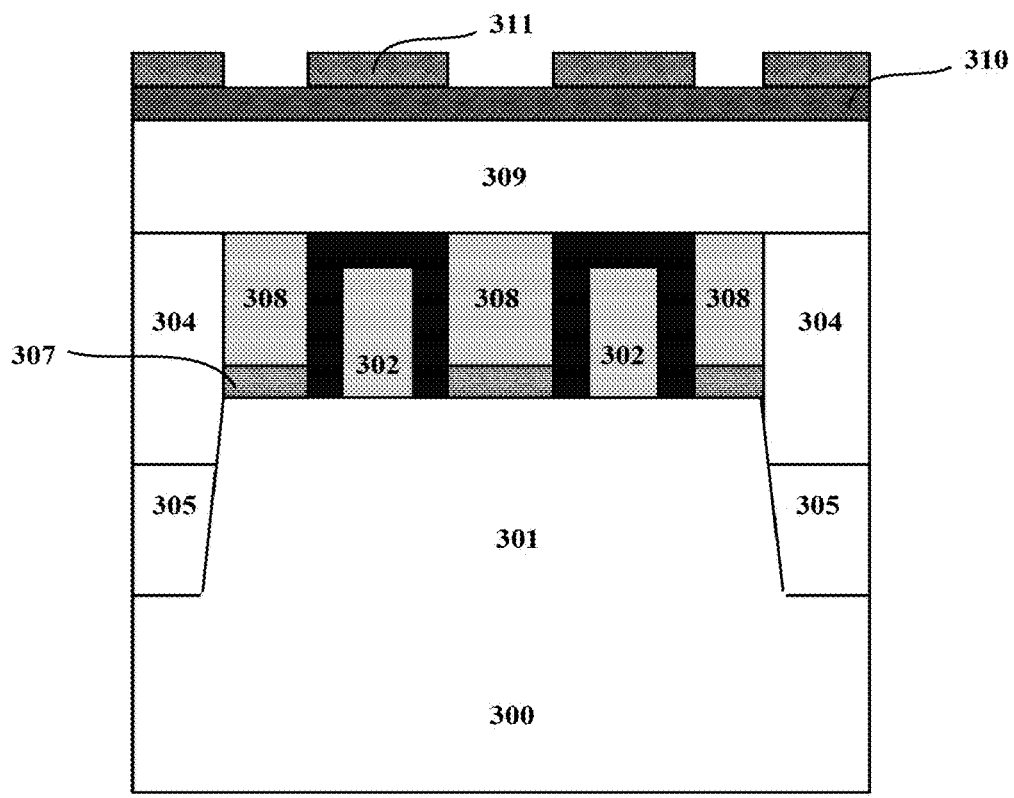

Referring to FIGS. 9A and 9B, a second mask layer 311, e.g., a photoresist, is formed on first DARC layer 310. Second mask layer 311 is patterned to form a second interconnect that is in a staggered arrangement relative to the first interconnect trench. FIG. 9B is an intermediate structure illustrating that patterned second mask layer 311 is formed on the first interconnect trench.

Figure 10A:
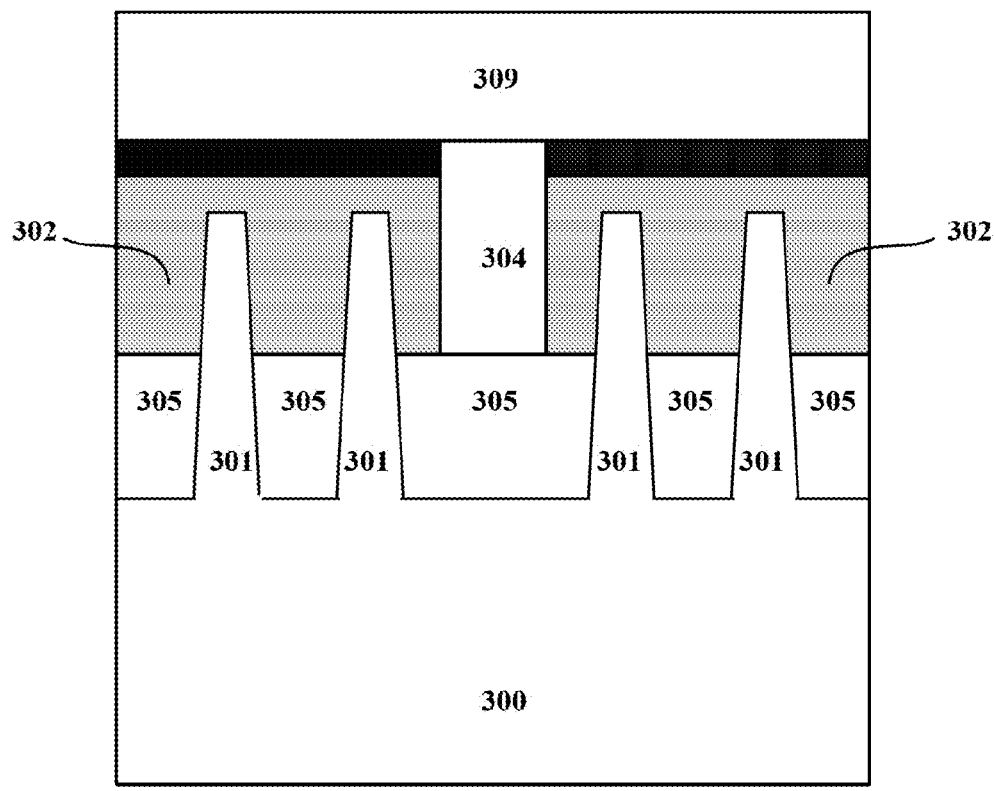
FIGS. 10A and 10B are respective cross-sectional views in the x-direction and in the y-direction illustrating an intermediate stage of a semiconductor device in a manufacturing method according to the embodiment of the present invention.
Figure 10B:
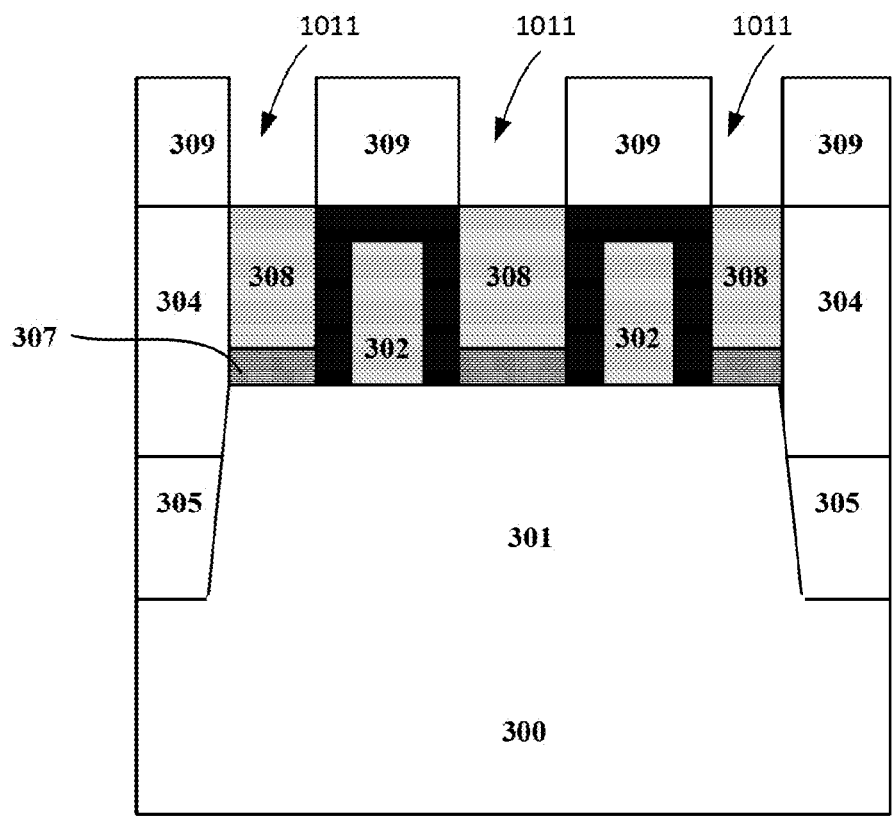

Referring to FIGS. 10A and 10B, an etching process is performed on second dielectric layer 309 to form a second interconnect trench 1011 that is arranged in a staggered pattern relative to the first interconnect trench. Second mask layer 311 is then removed. Those skilled in the art will appreciate that, in the vertical direction, the second interconnect trench is only required to be in contact with first metal layer 308 of the first interconnect trench, it is not required that the second interconnect trench completely overlaps the first interconnect trench. FIG. 10B is an intermediate structure illustrating that the second interconnect trench is formed on first metal layer 308 in a staggered arrangement, as shown in FIG. 16.

Figure 11A:
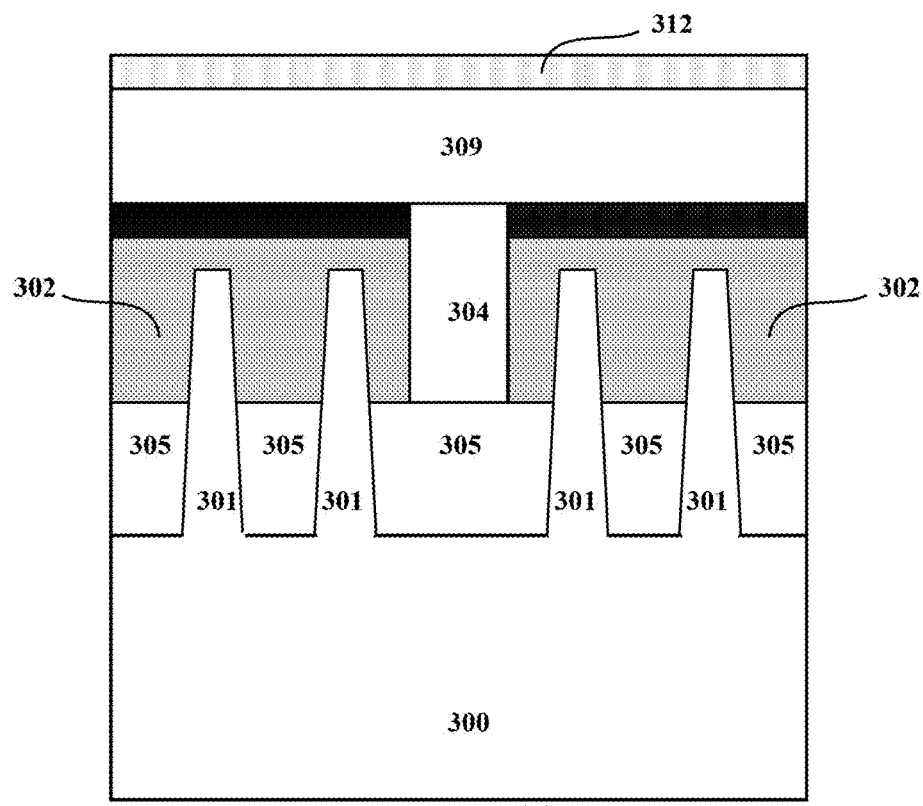
FIGS. 11A and 11B are respective cross-sectional views in the x-direction and in the y-direction illustrating an intermediate stage of a semiconductor device in a manufacturing method according to the embodiment of the present invention.
Figure 11B:
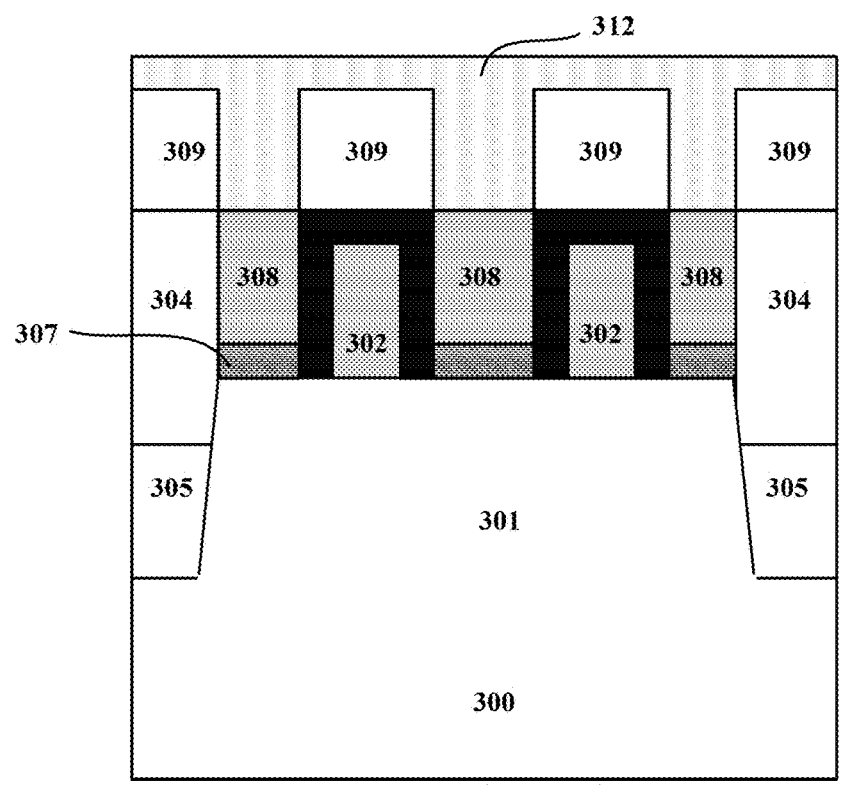

Referring to FIGS. 11A and 11B, an optical dispersive layer (ODL) 312 is formed on second dielectric layer 309 as a mask for etching hardmask layer 303. ODL 312 fills the second interconnect trench and covers second dielectric layer 309, as shown in FIGS. 11A and 11B.

Figure 12A:
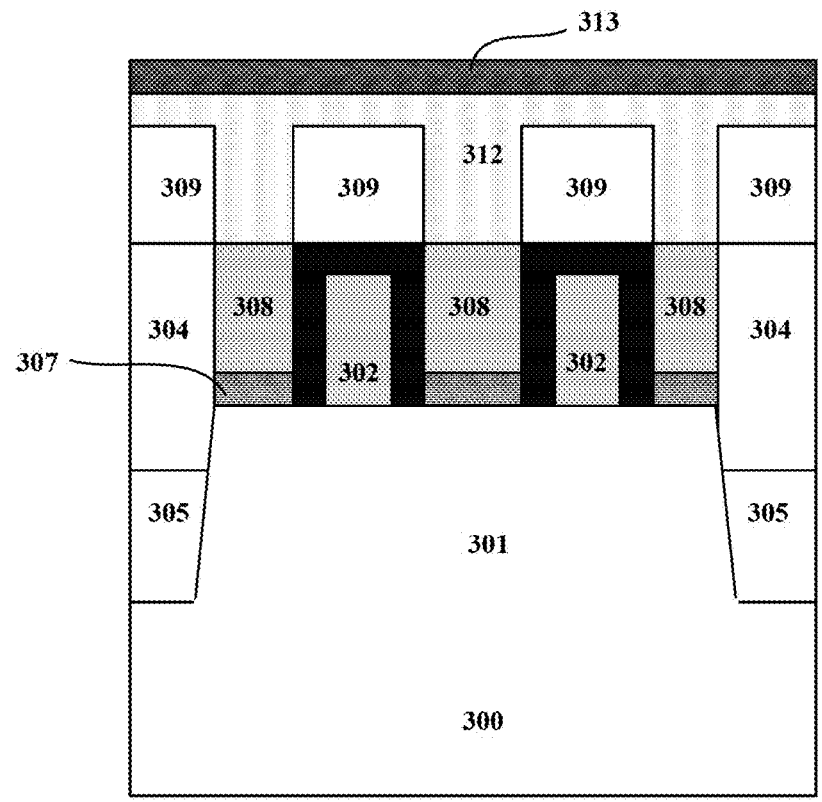
FIGS. 12A and 12B are respective cross-sectional views in the x-direction and in the y-direction illustrating an intermediate stage of a semiconductor device in a manufacturing method according to the embodiment of the present invention.
Figure 12B:
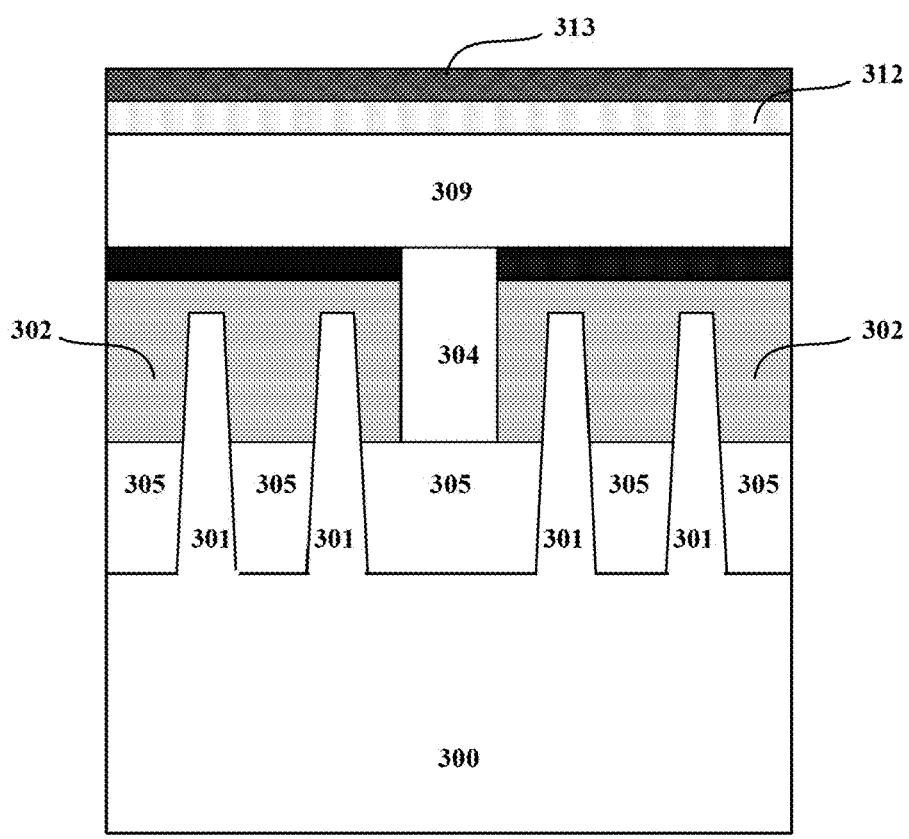

Referring to FIGS. 12A and 12B, a second DARC layer 313 is formed on ODL layer 312. Second DARC layer 313 covers ODL layer 312, as shown in FIGS. 12A and 12B.

Figure 13A:
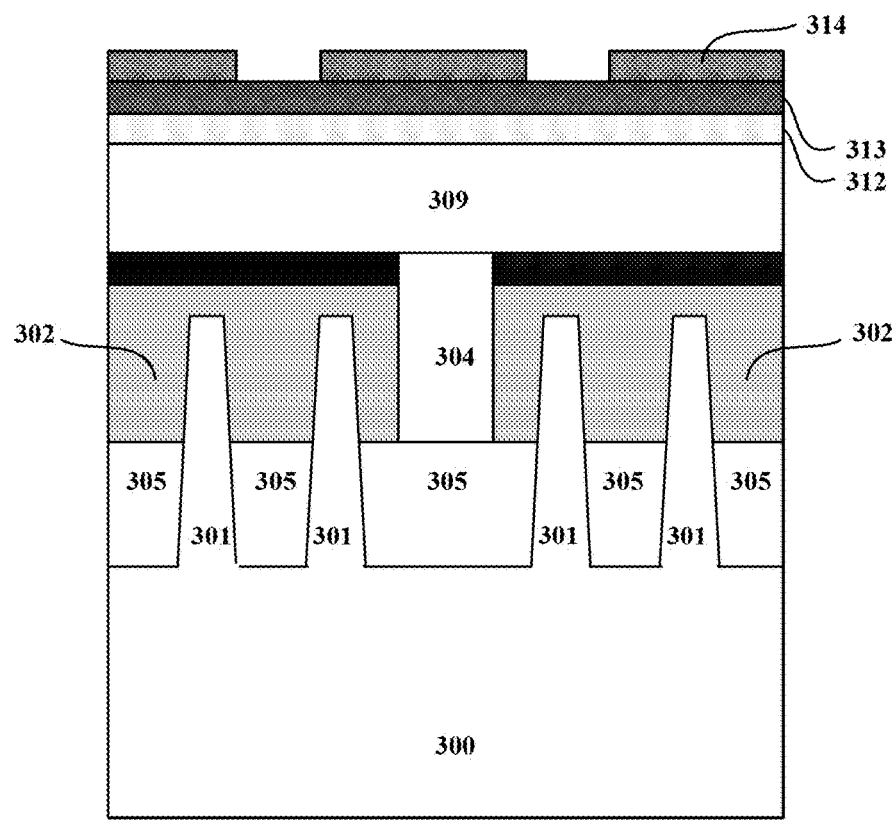
FIGS. 13A and 13B are respective cross-sectional views in the x-direction and in the y-direction illustrating an intermediate stage of a semiconductor device in a manufacturing method according to the embodiment of the present invention.
Figure 13B:
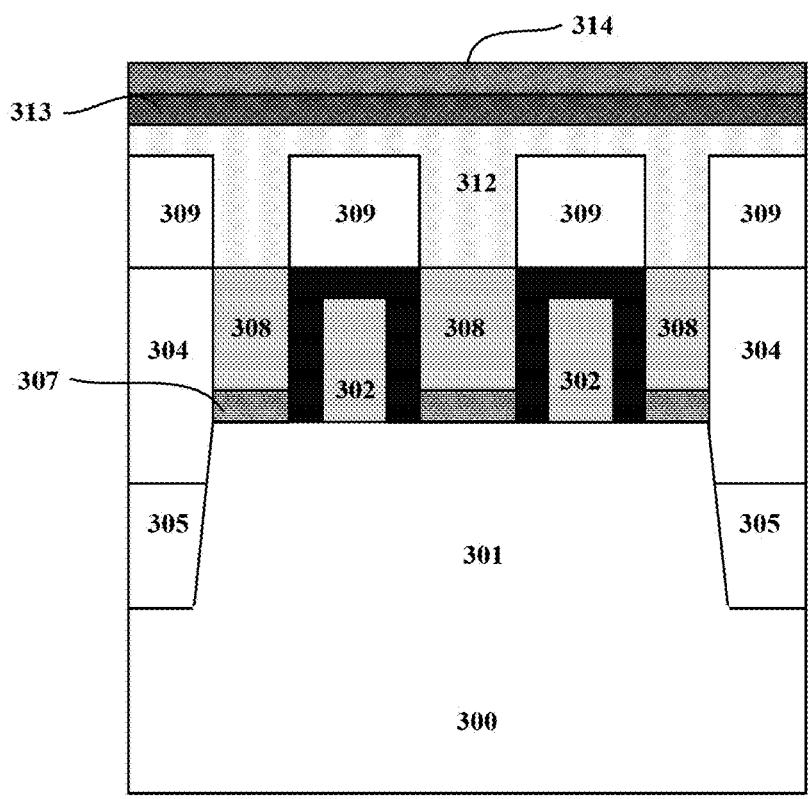

Referring to FIGS. 13A and 13B, a third mask layer 314, e.g., a photoresist, is formed on second DARC layer 313. Third mask layer 314 is then patterned to form a third interconnect trench. Patterned third mask layer 314 is formed on second DARC layer 313 and covers second DARC layer 313, as shown in FIGS. 13A and 13B.

Figure 14A:
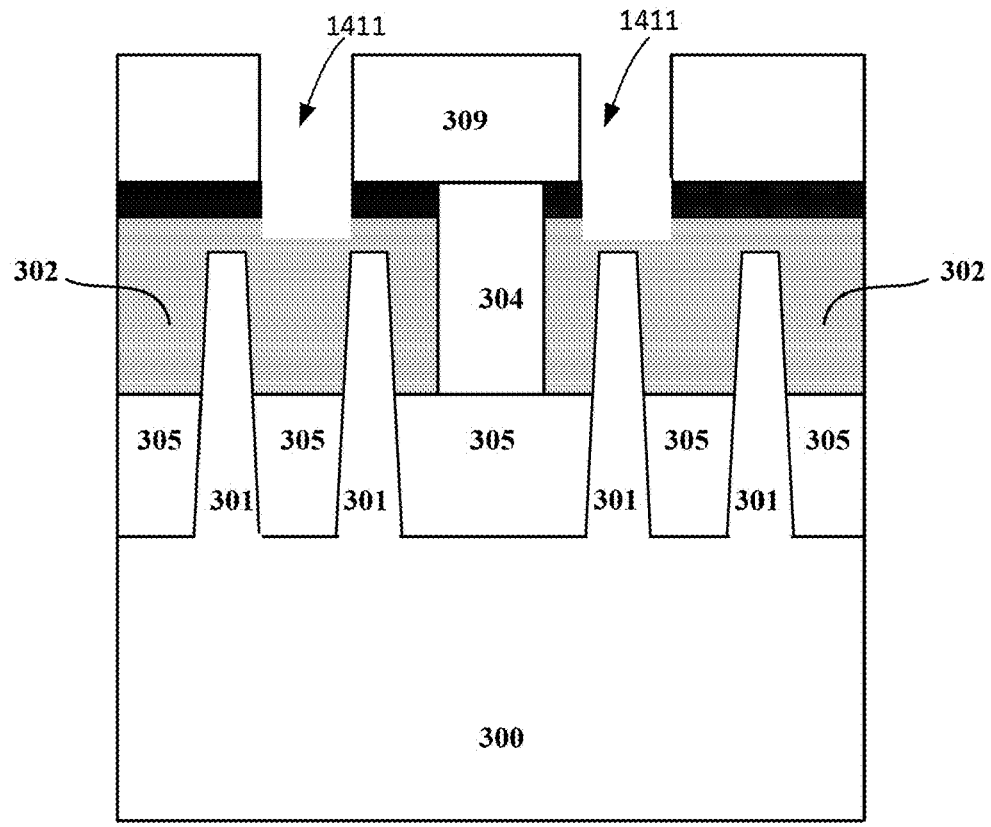
FIGS. 14A and 14B are respective cross-sectional views in the x-direction and in the y-direction illustrating an intermediate stage of a semiconductor device in a manufacturing method according to the embodiment of the present invention.
Figure 14B:
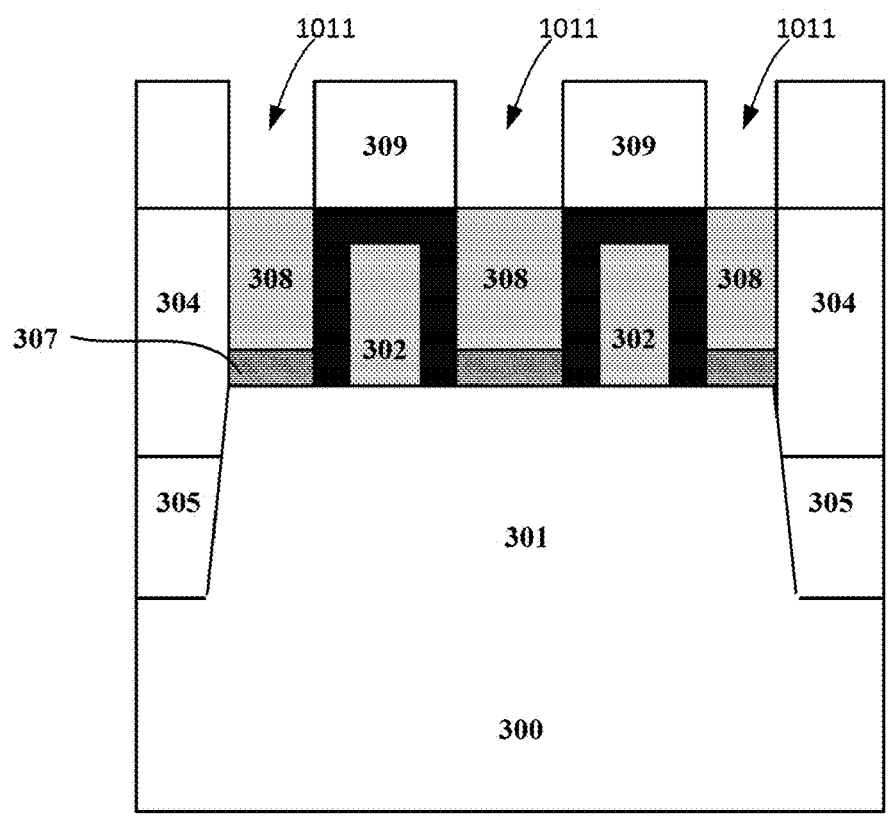

Referring to FIGS. 14A and 14B, a third etching process is performed using third mask layer 314 as a mask to remove a portion of ODL layer 312, a portion of second dielectric layer 309, and a portion of hardmask layer 303 to form a third interconnect trench 1411. Due to the presence of ODL layer 312, a portion of hardmask layer 303 is etched, and an exposed portion of second dielectric layer 309 is also etched to form the third interconnect trench 1411. Thereafter, third mask layer 314, second DARC layer, and ODL layer 312 are removed. The third interconnect trench is formed on gate 302, and the second interconnect trench is formed on the first interconnect trench, as shown in FIGS. 14A and 14B.

Figure 15A:
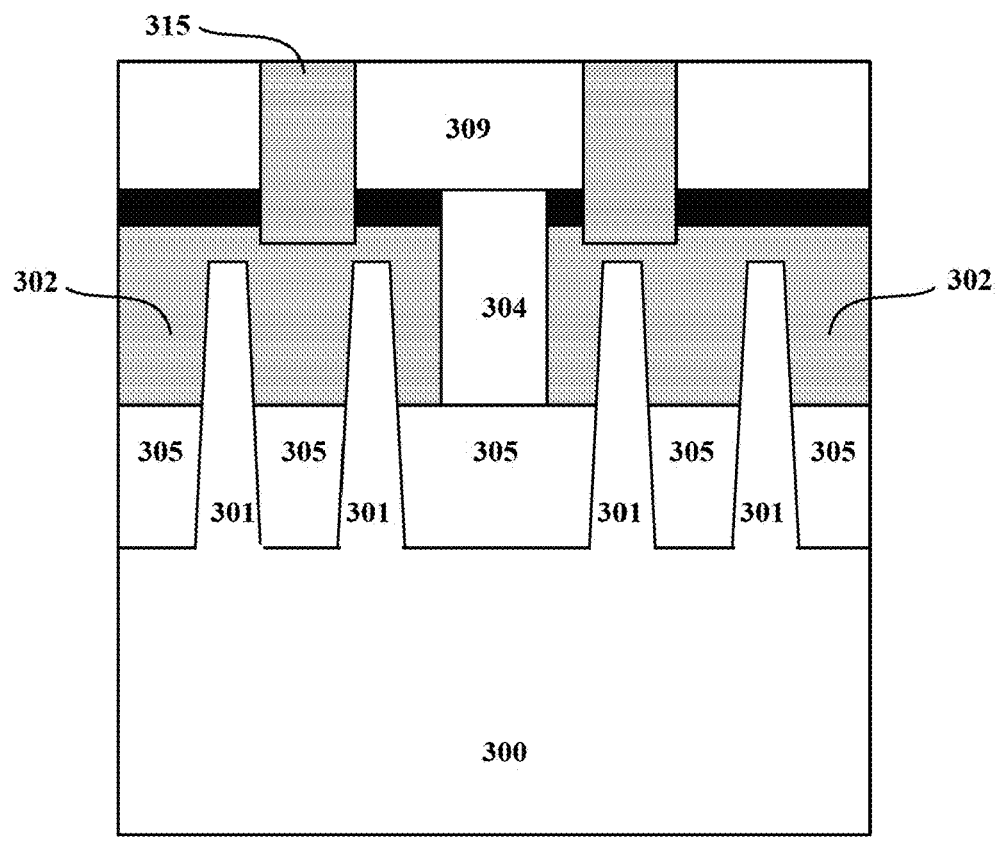
FIGS. 15A and 15B are respective cross-sectional views in the x-direction and in the y-direction illustrating an intermediate stage of a semiconductor device in a manufacturing method according to the embodiment of the present invention.
Figure 15B:
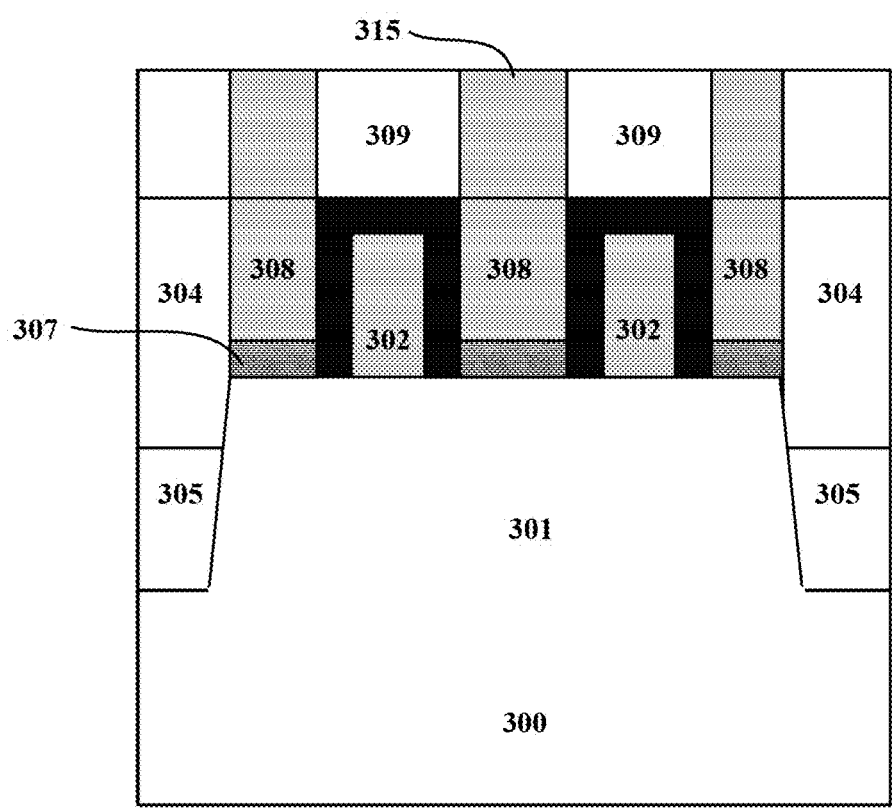

Referring to FIGS. 15A and 15B, a second metal layer 315 is deposited in the second and third interconnect trenches to form a local interconnect structure.

In an embodiment, the metal material of the second metal layer 315 may include, but not limited to, copper, tungsten, cobalt, nickel, titanium, aluminum, and other metal material, or titanium nitride, titanium nitride and electrically conductive metal oxides, electrically conductive metal carbides, and the like. The deposition of the second metal layer may be performed using any conventional metal deposition processes, such as sputtering, physical vapor deposition (PVD), and chemical vapor deposition (CVD) processes. Those of skill in the art will appreciate that second metal layer 315 and first metal layer 308 are not required to completely overlap each other, they are only required to have electrical contact with each other. After this process step, the first metal layer and the second metal layer form a local interconnect structure according to an embodiment of the present invention.

FIG. 16 is a plan view of a semiconductor device having a local interconnect structure according to an embodiment of the present invention. The semiconductor device includes a fin 401 on an active region, a gate 402 on the active region, a first metal layer 408 (shown as a dashed-line blocks), and a second metal layer 415 (shown as lines diagonally crossing across the blocks) arranged in a staggered pattern in relation with first metal layer 408. First metal layer 408 and second metal layer 415 form a local interconnect structure according to an embodiment of the present invention. Second metal layer 415 is disposed on first metal layer 408 and is in electrical and physical contact with first metal layer 408. The first interconnect trench is formed using one etching process, thereby avoiding the double patterning process to obtain a local interconnect structure having a metal silicide layer with a lower step coverage, while reducing the design constraints of the device and improving the device performance.

The foregoing descriptions of specific embodiments of the present invention have been presented for purpose of illustration and description. They are not intended to be exhaustive or to limit the invention to the precise forms disclosed, and obviously many modifications and variations are possible in light of the above disclosure. The exemplary embodiment has been described in order to best explain the principles of the invention and its practical application. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing a semiconductor device having a local interconnect structure, the method comprising:

providing a semiconductor substrate having a plurality of gates on an active region, a hardmask layer on the gates, and a first dielectric layer disposed between the gates;

performing a first etching process on the first dielectric layer to form a first interconnect trench on the active region, the first interconnect trench having an upper surface area;

forming a metal silicide layer at a bottom of the first interconnect trench;

forming a first metal layer filling the first interconnect trench;

forming a second dielectric layer on the gates and the first interconnect trench;

performing a second etching process on the second dielectric layer to form a second interconnect trench in a staggered pattern relative to the first interconnect trench, the second interconnect trench having a bottom surface area that extends over an edge portion of the upper surface area of the first interconnect trench and does not completely overlap the upper surface area of the first interconnect trench;

performing a third etching process on the second dielectric layer to form a third interconnect trench; and forming a second metal layer in the second interconnect trench and in the third interconnect trench to form the local interconnect structure.

2. The method of claim 1, wherein performing the first etching process comprises:

forming a first mask layer on the first dielectric layer;

patterning the first mask layer to expose a portion of the first dielectric layer on the active region;

etching the exposed portion of the first dielectric layer to form the first interconnect trench; and removing the first mask layer.

3. The method of claim 1, wherein performing the second etching process comprises:

forming a second mask layer on the second dielectric layer;

patterning the second mask layer to expose a portion of the second dielectric layer in a staggered arrangement relative to the first interconnect trench;

etching the exposed portion of the second dielectric layer to form the second interconnect trench in the staggered pattern relative to the first interconnect trench; and removing the second mask layer.

4. The method of claim 3, further comprising:

forming a first DARC layer between the second mask layer and the second dielectric layer;

performing the third etching process on the second dielectric layer to form the third interconnect trench; and removing the first DARC layer.

5. The method of claim 1, wherein performing the third etching process comprises;

forming an ODL layer on the second dielectric layer;

forming a third mask layer on the ODL layer;

patterning the third mask layer;

etching a portion of the ODL layer, a portion of the second dielectric layer, and a portion of the hardmask layer using the patterned third mask layer as a mask to form the third interconnect trench; and removing the third mask layer and the ODL layer.

6. The method of claim 5, further comprising:

forming a second DARC layer between the ODL layer and the third mask layer;

etching the ODL layer and the second dielectric layer to form the third interconnect trench; and removing the third mask layer, the second DARC layer, and the ODL layer.

7. The method of claim 1, wherein the gates are high-k dielectric metal gates.

8. The method of claim 1, wherein the metal silicide layer is a titanium silicide layer.

9. The method of claim 1, wherein the semiconductor substrate comprises a plurality of fins each having a fin active region.

10. The method of claim 9, further comprising a shallow trench isolation structure disposed between adjacent fins.

* * * * *